United States Patent
Gunji et al.

(10) Patent No.: US 7,875,156 B2
(45) Date of Patent: Jan. 25, 2011

(54) PROBE STORAGE CONTAINER, PROBER APPARATUS, PROBE ARRANGING METHOD AND MANUFACTURING METHOD OF PROBE STORAGE CONTAINER

(75) Inventors: Masanori Gunji, Hitachinaka (JP);
Katsunori Nakajima, Hitachi (JP);
Yasuhiko Nara, Hitachinaka (JP);
Tsutomu Saito, Hitachinaka (JP);
Shigeru Izawa, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 133 days.

(21) Appl. No.: 12/027,644

(22) Filed: Feb. 7, 2008

(65) Prior Publication Data
US 2008/0204058 A1 Aug. 28, 2008

(30) Foreign Application Priority Data
Feb. 28, 2007 (JP) ............................. 2007-049929

(51) Int. Cl.
*C23C 14/34* (2006.01)
(52) U.S. Cl. ............................. 204/192.34; 204/298.35; 204/298.36
(58) Field of Classification Search ............ 204/192.34, 204/298.35, 298.36
See application file for complete search history.

(56) References Cited

U.S. PATENT DOCUMENTS
5,004,977 A * 4/1991 Kazama .................. 324/756

FOREIGN PATENT DOCUMENTS

| JP | 6-66557 A | 3/1994 |
| JP | 6-109415 A | 4/1994 |
| JP | 9-262079 A | 10/1997 |
| JP | 2006-125909 A | 5/2006 |
| WO | WO 2006/138593 A1 * | 12/2006 |

* cited by examiner

*Primary Examiner*—Rodney G McDonald
(74) *Attorney, Agent, or Firm*—Crowell & Moring LLP

(57) ABSTRACT

A probe storage container can supply a probe in a prober apparatus without being exposed to an atmospheric air. Preferably, the probe is stored in the probe storage container by removing an oxide film in a leading end portion of the probe in accordance with a dry treatment using an ion source, for example, without being exposed to the atmospheric air. It is thus possible to replace and attach the probe with respect to the prober apparatus without being exposed to the atmospheric air, avoiding formation of an oxide film on a surface of the probe. Further, a worker attaching the probe to the prober apparatus can work without being directly in contact with the probe, and it is possible to prevent the leading end portion of the probe from being broken. Accordingly, it is possible to stably measure an electric characteristic of a semiconductor device or the like on the wafer.

6 Claims, 4 Drawing Sheets

PROBE STORAGE CONTAINER, PROBER APPARATUS, PROBE ARRANGING METHOD AND MANUFACTURING METHOD OF PROBE STORAGE CONTAINER

BACKGROUND OF THE INVENTION

1. Field of the Invention

The present invention relates to a method of storing and manufacturing a prober apparatus which checks a position of a refined wiring or the like on a semiconductor integrated circuit or the like by a scanning electron microscope, and measures an electric characteristic by bringing a probe into contact with a wiring electrode or the like while monitoring a state by the scanning electron microscope.

2. Description of the Related Art

The prober apparatus is an apparatus for measuring an electric characteristic by bringing a probe into contact with a wiring position while observing a refined wiring position on a semiconductor integrated circuit by a microscope. In recent years, a measured portion becomes refined on the basis of a micro-fabrication of the semiconductor, and can not be checked by an optical microscope, and a scanning electron microscope utilizing an electron beam has been utilized. As a material of the probe, it is demanded that the material has a durability and is hard, and further has a resistance against the electron beam, and a tungsten or a tungsten alloy has been generally utilized.

The tungsten is easily tapered its leading end portion in accordance with an electrolytic etching by an aqueous sodium hydroxide or an aqueous potassium hydroxide, however, has a defect that the tungsten tends to be oxidized in an atmospheric air.

Accordingly, in order to increase a reliability of an electric contact of the tungsten probe, as a means end for achieving an oxidation prevention of a surface, there is shown a method of coating in accordance with a plating after forming a leading end in a predetermined shape, and a method of removing an oxidation preventing layer just before using a metal probe to which the oxidation preventing layer is applied so as to use. Further, as a method of storing a powder and granular material and a food product, there is shown a method of storing by a vacuum container.

Patent Document 1: Japanese Patent Application Laid-Open No. 6-109415

Patent Document 2: Japanese Patent Application Laid-Open No. 6-66557

Patent Document 3: Japanese Patent Application Laid-Open No. 9-262079

SUMMARY OF THE INVENTION

As a result of an eager study of the inventor of the present invention, the following problems have been known.

In the probe of the prober apparatus, the electric characteristic of the electrode on the wafer can not be measured by an oxide film formed in the leading end portion in the process of manufacturing the probe. In particular, in the case that the measured material is refined or an interval between the measured materials becomes narrow, it is necessary to taper the leading end portion of the probe, however, if a radius of curvature of the leading end portion becomes equal to or less than 50 nm, it is impossible to secure a conduction with the measured material due to the oxide film on a surface of the leading end even if the tapered leading end portion is formed.

On the other hand, in the probe of the prober apparatus, it is necessary to break a natural oxide film formed in the measured material by being directly brought into contact with the measured material, and it is desirable to employ a hard material having an improved conductivity and a durability, and further having an improved electron beam resistance. As means for securing the conductivity of the probe, there is a method of coating the surface in accordance with a plating or the like, however, the plating material is peeled at a time of the contact with the measured material, and there is generated a phenomenon that the electrodes are short circuited by the peeled plating material.

On the other hand, in the metal probe in which the oxidation preventing film such as the resin or the like is applied to the leading end portion, it is necessary to remove the film just before the use. However, since a series of works are executed in the atmospheric air, there is a risk that the natural oxide film is formed in the probe leading end portion in some working environment state, working time and attaching time to the prober apparatus, or a foreign material is attached to the leading end portion in the process of removing the oxide film. Accordingly, the greatest care is necessary for the oxide film removing process. Further, there is a possibility that the leading end portion is broken by dropping the probe or making the leading end portion of the probe in contact at a time of attaching the probe.

An object of the present invention relates to an arrangement of a manufactured probe in a prober apparatus without being exposed to an atmospheric air.

The present invention relates to a probe storage container which can supply a probe in a prober apparatus without being exposed to an atmospheric air.

Preferably, the probe is stored in the probe storage container by removing an oxide film in a leading end portion of the probe in accordance with a dry treatment using an ion source or the like, without being exposed to the atmospheric air.

In accordance with the present invention, it is possible to replace and attach the probe with respect to the prober apparatus without being exposed to the atmospheric air, and it is possible to avoid a formation of the oxide film on a surface of the probe. Further, a worker attaching the probe to the prober apparatus can work without being directly in contact with the probe, and it is possible to prevent the leading end portion of the probe from being broken. Accordingly, it is possible to stably measure an electric characteristic of a semiconductor device or the like on the wafer.

DESCRIPTION OF THE PREFERRED EMBODIMENTS

First Embodiment

In the present embodiment, in order to prevent an exposure to the atmospheric air after removing an oxide film in a leading end portion of a probe of a prober apparatus, a probe storage container capable of sealing an inner portion is used, a storage and supply chamber is provided in a prober apparatus having an oxide film removing step, a leading end portion shape measuring step and a scanning electron microscope, and an attachment of the probe to the prober apparatus from a removal of the oxide film is executed without being exposed to the atmospheric air.

Figure 1:
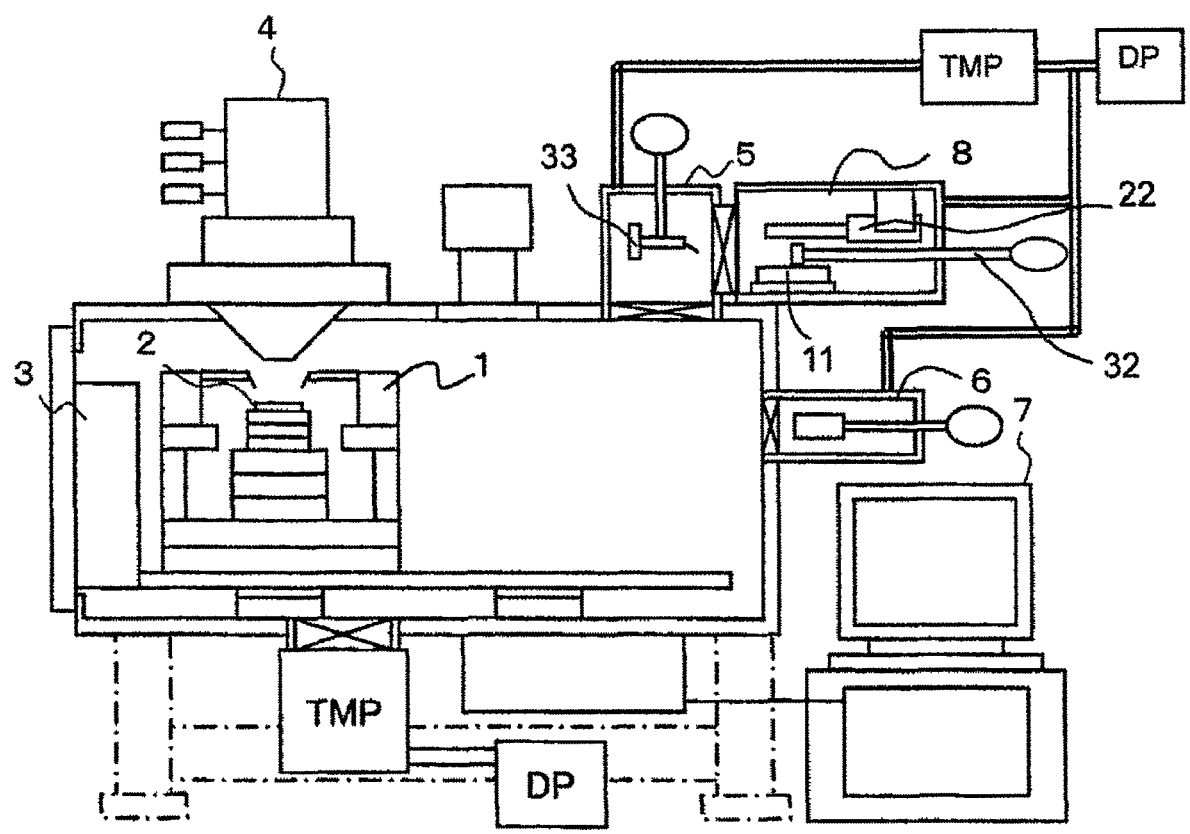
FIG. 1 is a prober apparatus mounting a scanning electron microscope therein in accordance with a first embodiment.

FIG. 1 shows an outline of a prober apparatus mounting a scanning electron microscope in accordance with the present embodiment. The apparatus is provided with a sample chamber 3 having a probe unit 1 moving a probe tracing a sample within the sample chamber and a sample stage 2 mounting the sample built-in, and a chamber in which the sample and the probe are arranged, as a chamber in which the sample and the probe are arranged. Further, the apparatus is provided with an electron gun portion 4 of an electronic optical apparatus constituted by an electron source generating an electron, various apertures, a condenser lens for focusing the electron, a deflecting coil, an objective lens, an ion pump making each of the portions high vacuum, a secondary electron detector and the like, and a probe replacing chamber 5 capable of replacing the probe without breaking the vacuum of the sample chamber 3. Further, the apparatus is provided with a sample replacing chamber 6 capable of replacing the sample without breaking the vacuum and an exhaust apparatus achieving a vacuum exhaust, as an exhaust mechanism capable of exhausting the inner portion of the probe supply chamber. Further, the apparatus is structured by a control display portion 7 constituted by a control apparatus, an image display portion, an image display control portion and a control display apparatus. A probe supply chamber 8 structured such that a vacuum exhaust can be achieved via a gate valve and provided with a door portion to the chamber is added to the sample replacing chamber 6.

Figure 2:
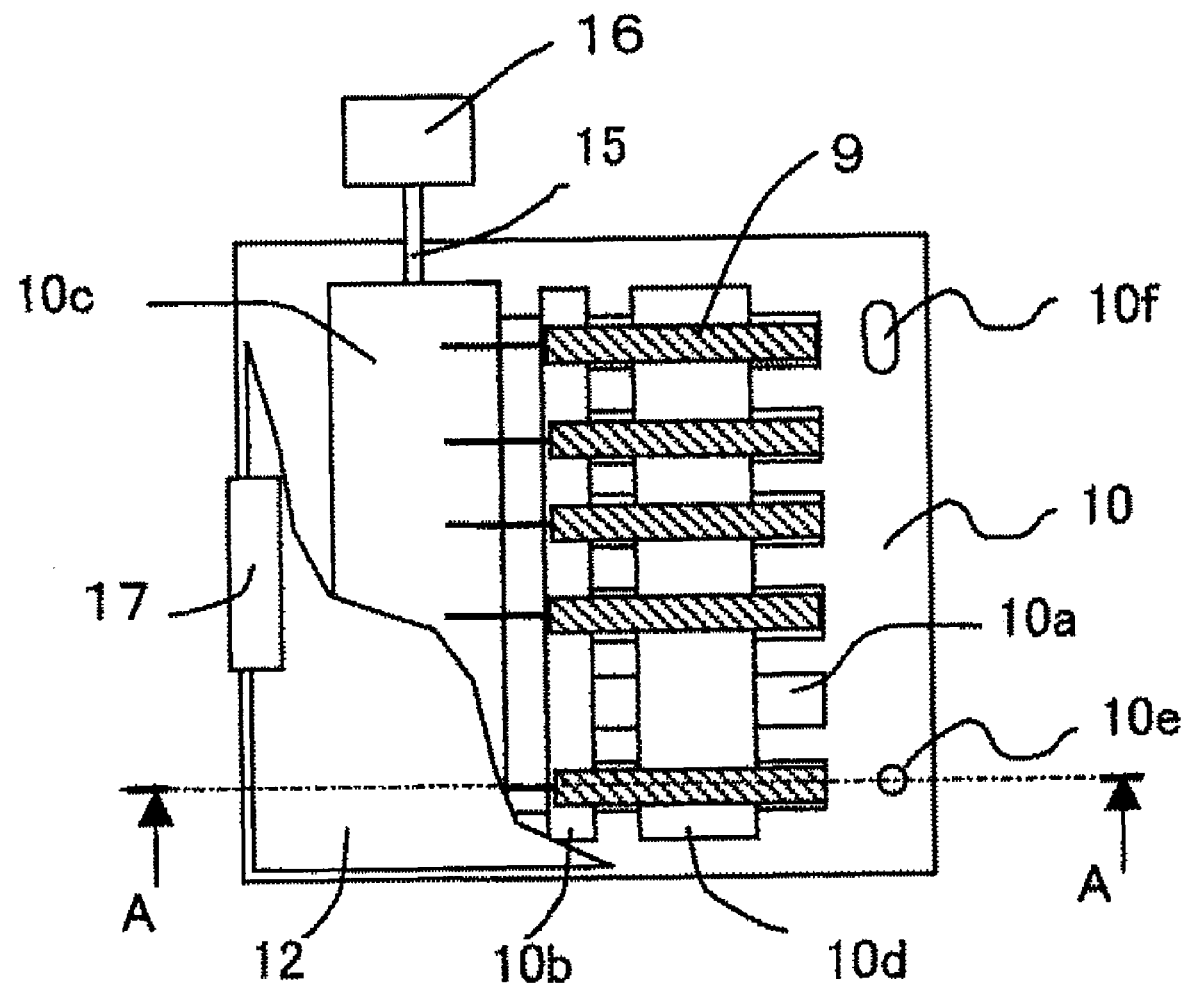
FIG. 2 is a schematic view of a structure of a probe storage container in accordance with the first embodiment.
Figure 2:
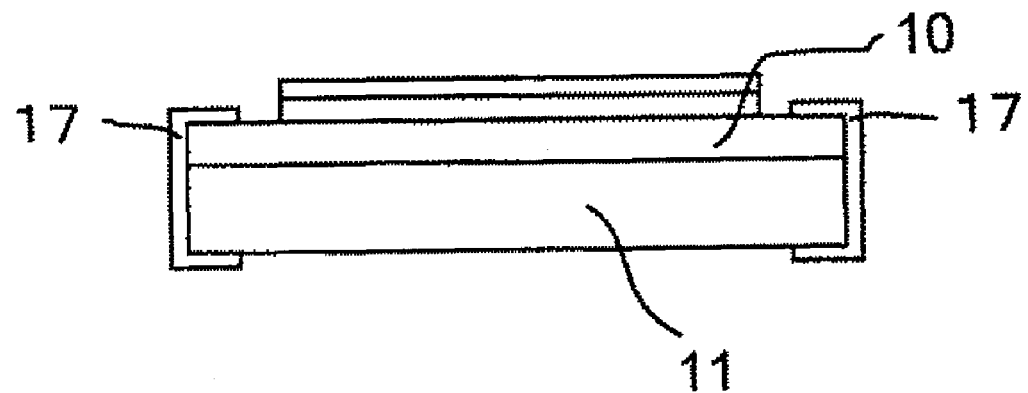
Figure 3:
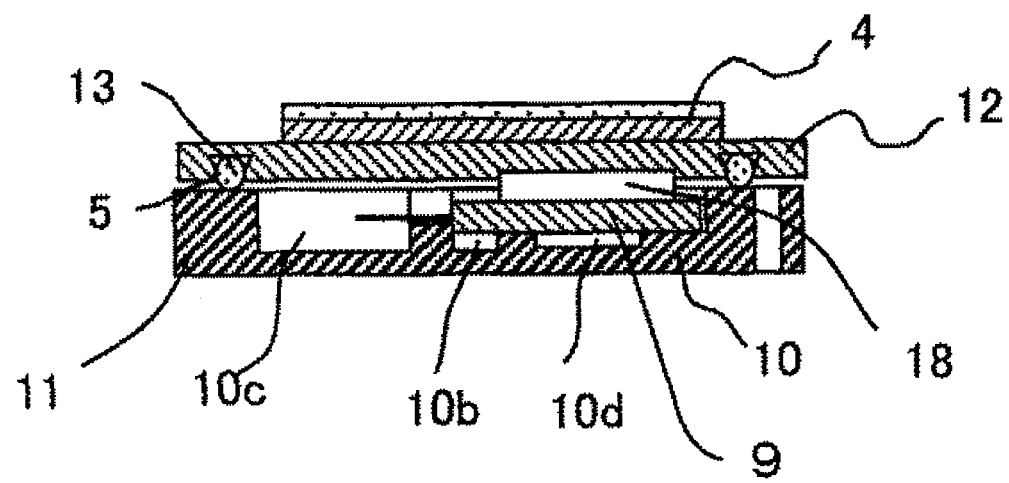
FIG. 3 is a cross sectional view of the probe storage container in accordance with the first embodiment.

FIG. 2 is a schematic view of a structure of the probe storage container accommodating the probe used for the prober apparatus, in accordance with the first embodiment, and FIG. 3 is a cross sectional view of the probe storage container in accordance with the first embodiment.

A probe 9 is formed by caulking and bonding a tungsten wire having a diameter of 0.05 mm and a length of 15 mm to a copper sleeve having a diameter of 0.5 mm and a length of 9 mm. A leading end portion of the probe 9 is desirably made of a tungsten, a tungsten alloy or a metal processed in a needle shape. The bonded probe raw material is electrolytic polished by NaOH water solution, a radius of curvature of the leading end is processed to 50 nm or less, and a total length is set to 10 mm. The radius of curvature of the leading end portion is checked by a scanning electron microscope under an acceleration voltage of 5 kV and a magnification of 30000 folds. A storage base 10 corresponding to a probe holding portion for holding the probe at a predetermined position in an inner portion of the probe storage container is made of a stainless steel, and is provided with a groove 10a to which a copper pipe portion of the probe 9 is inserted, a clearance groove 10b for the caulked portion of the copper sleeve, a groove 10c having a sufficient margin for preventing the leading end portion of the probe from being brought into contact with a periphery, and a groove 10d for taking out the probe. Further, a hole 10e is provided at a diameter 4 mm as a reference position of the storage container 11, which forms a reference portion for positioning the probe storage container with respect to the prober apparatus, and a long hole 10f for determining a posture of the reference hole of the storage container 11 is provided. It is manufactured at a dimensional accuracy equal to or less than 0.1 mm. With respect to the reference position, a pitch accuracy of each of the grooves of the probe is set to be equal to or less than 0.1 mm. Further, in order to keep the inner portion of the probe in a vacuum state, a fluorine O-ring is used as a buffering material a 13 in an upper lid 12 corresponding to a lid portion capable of sealing the inner portion in which the probe is stored, and a surface coming into contact with the O-ring is mirror finished as a structure of a dovetail groove 14 for preventing the O-ring from coming off. Further, the storage base 10 is provided with an intake port 15 capable of exhausting an air in the inner portion, and a valve 16 shutting off an ambient air is provided in a leading end thereof. In other words, the probe storage container is provided with the intake port for making the inner portion of the container in a vacuum condition, and the valve for shutting off the inner portion of the container from the ambient air.

After exhausting the inner portion of the storage container 11 constructed by the elements mentioned above and closing the valve, a holding block 17 for holding a state is provided. At this time, a vacuum meter for controlling the state of the inner portion may be additionally provided.

Further, if a gap exists between the upper lid 12 and the probe, a scratch is generated on a surface due to a vibration at a time of transferring. Accordingly, it is preferable to put a buffering material 18 in the lid side. At this time, it is desirable that the buffering material b 18 employs a material which is hard to generate an out gas or a material from which a gas is sufficiently discharged by burning out.

The material of the storage container 11 may be a plastic material in place of the metal, however, if it is not a conductive material, an electron is charged on a surface so as not to be measured at a time of checking the leading end shape by the electron microscope while the storage base 10 being as it is. Accordingly, it is desirable that the material has a resistance against an electron beam and is constituted by a conductive material. Further, since there is a risk that the out gas is generated from the inner portion during the vacuum storage, it is desirable that a mechanism for heating by a lamp heater or the like is provided for previously burning out in the vacuum condition.

The stored number of the probe in the storage container 11 is set to six administratively. Although the stored number is not particularly defined, a stored number having one or more larger than the number that the prober apparatus can set the probes, for example, the stored number of six in the case that the number of the probes which can be set is five, taking into consideration a recovery of the replaced probe.

After electrolytic polishing the leading end portion of the probe, the probe is put in the storage base 10 one by one, the upper lid 12 is set, and the storage base 10 is evacuated by the exhaust apparatus, for example, a dry pump until the inner portion comes to several Pascal, and is held by the holding block 17. At this time, a holding method of the upper lid 12 may employ a screw.

Next, a dry etching is applied for removing an oxide film formed in the leading end portion in the manufacturing step.

The dry etching employs a milling apparatus which ionizes an argon in the vacuum and accelerates an argon ion so as to process.

Figure 4:
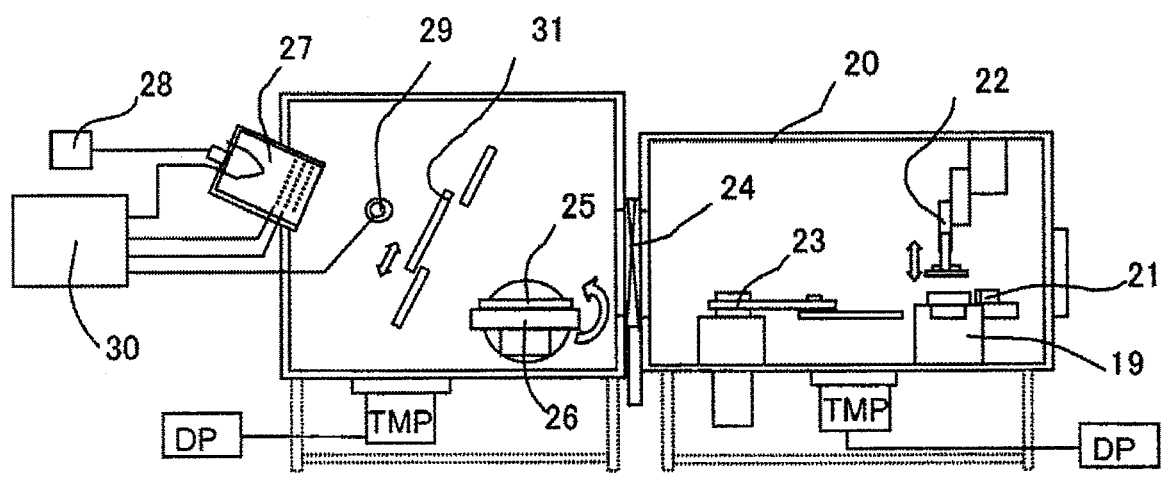
FIG. 4 is a view showing an applied example of a milling apparatus in accordance with the first embodiment.

FIG. 4 shows a schematic view of the milling apparatus additionally provided with the storage container supply chamber.

At a time of manufacturing the probe storage container of the prober apparatus, the oxide film at least in the leading end portion of the probe is removed by using the ion beam apparatus without being exposed to the atmospheric air, the probe is stored in the probe storage container, and the lid portion of the probe storage container is closed. Specifically, it is executed, for example, as follows.

The storage container 11 in which the probe having the processed leading end is put is mounted on a storage base stage 19. A pin is additionally provided in the storage base stage 19, whereby positions of the storage base stage 19 and the storage container 11 are determined. Next, the storage container supply chamber 20 is evacuated by a vacuum exhausting apparatus constituted by a dry pump (DP), a turbo molecular pump (TMP) and the like. A vacuum state is monitored by a vacuum meter. The holding block 17 is detached by a block attaching and detaching mechanism 21, and the upper lid 12 of the storage container 11 is detached by an upper lid opening and closing mechanism 22. Next, a gate valve 24 is opened by a supply base feeding mechanism 23, and the storage container base 10 is set to a milling stage 25 for processing the milling apparatus. At this time, since the storage container base 10 is processed in a tilted state at a time of being milled, it is desirable to provide a holding means in the milling apparatus side. Further, a holding mechanism may be provided in the storage container base 10 side. Further, since the milling stage 25 is provided with a stage rotating mechanism 26 of an autorotation mechanism for executing the process while rotating on its own axis. The argon ion is generated by an ion source 27, a gas supplying apparatus 28 for supplying an argon gas, a neutralizer 29 for neutralizing the argon ion and an ion source power supply 30.

The milling is executed by setting the milling stage 25 so as to come to 45 degree with respect to the ion source. A condition for removing the oxide film is set by using a time for which a milling shutter 31 is open and a draw-out voltage in the ion source as a parameter. Further, if a gold is coated in an inner side of the groove 10c of the storage container base 10, the gold is sputtered by the argon ion, and the gold is coated on the other portions of the probe than the portion to which the argon ion is irradiated, whereby it is possible to differentiate the portion from which the oxide film is removed, from the other portions. Accordingly, if a television camera enlarging the leading end portion is provided, for example, in the probe take-out portion of the prober apparatus so as to observe the leading end portion, it is possible to check whether or not the milling process is executed, because the other portions than the portion from which the oxide film of the probe is removed is coated by the gold.

Further, it is possible to employ a milling method of taking out the probe one by one from the storage base 10 so as to execute the milling. The diameter of the leading end may be finished to the predetermined dimension by the milling step in place of the electrolytic process mentioned above. In this case, since the oxide film in the leading end portion is removed in the step of finishing to the predetermined dimension, it is preferable to prevent the steps after the milling from being exposed to the atmospheric air.

After the milling process, the gate valve 24 is opened, the storage container base 10 is taken out from the milling stage 25 by the supply base feeding mechanism 23, and the upper lid 12 of the storage container 11 is attached by the upper lid opening and closing mechanism 22. Next, the holding block 17 is attached by the block attaching and detaching mechanism 13, and the vacuum condition is held. After closing the gate vale 24, the storage container supply chamber 20 is open to the atmospheric air, and the storage container 11 is taken out. After taking out, the storage container 11 is put in an aluminum vacuum package, the atmospheric air in the inner portion is evacuated so as to be in the vacuum state, and the sealing portion is heated and sealed. At this time, it is possible to achieve a long-term storage by putting a deoxidizer or a moisture absorbent within the vacuum package.

Figure 5:
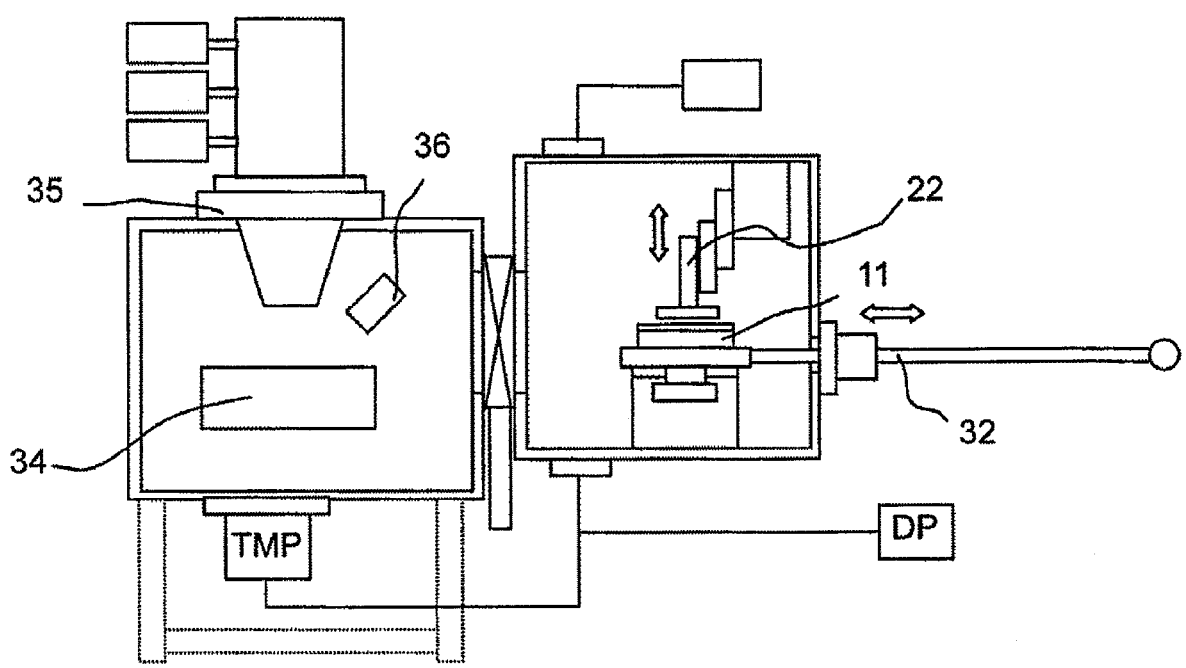
FIG. 5 is a schematic view of the prober apparatus using the probe storage container in accordance with the first embodiment.

FIG. 5 shows a schematic view of the prober apparatus using the storage container 11. At a time of arranging the probe in the prober apparatus, the probe storage container storing the probe is held at a predetermined position within the probe supply chamber of the prober apparatus, and the probe supply chamber is evacuated. Further, the lid portion of the probe storage container is opened within the probe supply chamber, and the probe in the probe storage container is arranged in the chamber of the prober apparatus. Describing a specific example, at a time of using the probe in the prober apparatus provided with the scanning electron microscope, the storage container 11 is taken out from the vacuum package, the holding block 17 is detached, and the storage container 11 is set to the stage of the probe supply chamber 8. The probe supply chamber 8 is evacuated by the dry pump, the upper lid 12 is opened by the upper lid opening and closing mechanism 22 corresponding to the container opening and closing mechanism capable of opening and closing the lid portion of the probe storage container, and the probe is attached to a leading end of a probe holder 33 structured such that a support pipe supporting the probe and an arm fixing the support pipe are integrally formed, by a probe supplying mechanism 32 capable of arranging the probe of the probe storage container in the chamber.

In the case of measuring an electric characteristic of a device of a semiconductor integrated circuit by using the probe manufactured as mentioned above, it is possible to secure a conductivity and measure with a stable characteristic.

Further, the scanning type electron microscope provided with the upper lid opening and closing mechanism 22 is used for checking the radius of curvature of the leading end portion in a midstream step. The probe storage container 11 is set in a state of detaching the holding block 17, and is set to the vacuum state by the dry pump, the upper lid 12 of the probe storage container 11 is detached by the upper lid opening and closing mechanism 22, and the storage container base 10 is transferred to a sample observing stage 34 measuring from the sample chamber by the supply base feeding mechanism 23. The leading end portion of the probe is observed at a magnification of 30000 folds by a scanning electron microscope constituted by an electronic optical system 35 discharging, accelerating and converging the electron, a secondary electron detector 36 detecting a secondary electron output from the measured material, an exhaust apparatus holding the vacuum state, and the like. It is desirable to sort the leading end diameter in correspondence to the diameter and the pitch of the measured material at a time of being actually used, on the basis of the result of observation of the leading end portion. Since the probe is not exposed to the atmospheric air in the midstream step, there is not generated such a defect that the measurement can not be executed due to the oxide film on the surface of the probe, and it is possible to stably measure the electric characteristic of the device in the semiconductor integrated circuit.

In accordance with the present embodiment, since the worker attaching the probe can execute the replacing and attaching work without directly touching the probe, it is possible to prevent the leading end portion of the probe from being damaged. Further, since the probe is not exposed to the atmospheric air from the process of removing the oxide film in the leading end of the probe to the attachment to the prober unit of the apparatus, including the storage, the oxide film is not formed on the surface of the probe, and it is possible to stably measure the electric characteristic of the semiconductor device or the like on the wafer. Accordingly, this is considered to be a technique necessary for evaluating the characteristic of the semiconductor device on the basis of the micro-fabrication of the semiconductor in the future.

Second Embodiment

In order to prevent the oxidation of the tungsten probe, the inner side of the storage container may be replaced by an inert gas, for example, a nitrogen or the like in addition to the vacuum state. In the present embodiment, a description will be given of a case that the inert gas is filled within the storage container while focusing on a different point from the first embodiment.

In the milling step of the first embodiment, after removing the oxide film by the milling process of the leading end portion of the probe, a dry nitrogen gas is introduced to the probe storage container 11 in the storage container supply chamber 20 by an inert gas supplying apparatus 37. The upper lid 12 is set by the upper lid opening and closing mechanism 22 at a time when the atmospheric pressure is achieved by the vacuum meter, and the holding block 17 holds the storage container 11 in such a manner as to prevent the nitrogen gas from leaking. Next, the storage container is taken out of the storage container supply chamber 20, and is put in the aluminum package so as to be stored. At this time, it is possible to store for a long term by sealing the deoxidizer or the like in the package.

At a time of actually using, the storage container is taken out from the aluminum package, and the storage container is set to the table of the opening and closing apparatus of the prober apparatus provided with the electron microscope with the opening and closing apparatus. After the nitrogen is introduced after exhausting the inner side of the opening and closing apparatus by the vacuum exhausting apparatus so as to set to the vacuum state, and the inner side of the chamber is filled with the nitrogen, the upper lid is detached. Next, the inner side of the chamber is set to the vacuum state by the vacuum exhausting apparatus, and the probe is set to the holder. At this time, the opening and closing valve may be opened after attaching the opening and closing valve to the storage container and vacuum exhausting the inner side of the chamber, and then the upper lid may be detached by the opening and closing apparatus in the vacuum state.

In the case of setting the probe stored for one month in the storage container mentioned above after the milling process to the probe apparatus, and measuring the electric characteristic of the semiconductor, the conductivity can be secured, and the stable measurement can be achieved.

What is claimed is:

1. A method comprising the steps of:
   removing an oxide film at least in a leading end portion of a probe by using an ion beam apparatus, without being exposed to an atmospheric air;
   storing said probe in a probe storage container without being exposed to the atmospheric air;
   closing a lid portion of said probe storage container without being exposed to the atmospheric air;
   transferring the probe storage container into a probe supply chamber of a prober apparatus, with the lid portion closed;
   evacuating the probe supply chamber;
   opening the lid portion of the probe storage container after the probe supply chamber is evacuated; and
   positioning the probe in a chamber of the prober apparatus.

2. The method as claimed in claim 1, wherein portions of said probe other than the portion in which the oxide film is removed are coated with gold.

3. The method as claimed in claim 1, wherein the leading end portion of said probe is made of a tungsten or a tungsten alloy.

4. The method as claimed in claim 1, wherein the probe storage container is provided with an intake port for forming a vacuum in an inner portion of the container, and a valve for shutting off the inner portion of the container from an ambient air.

5. A method comprising the steps of:
   removing an oxide film at least in a leading end portion of a probe by using an ion beam apparatus, without being exposed to an atmospheric air;
   receiving the probe in a prober storage container that has an inert gas introduced therein;
   closing a lid portion of the probe storage container with the inert gas introduced therein;
   transferring the probe storage container into a probe supply chamber of a prober apparatus with the lid portion closed;
   evacuating the probe supply chamber;
   opening the lid portion of the probe storage container after the probe supply chamber is evacuated; and
   positioning the probe in a chamber of the prober apparatus.

6. The method as claimed in claim 1, wherein an inner portion of the container is filled with a nitrogen gas.

* * * * *